United States Patent
Shimo et al.

(10) Patent No.: US 6,441,612 B1
(45) Date of Patent: Aug. 27, 2002

(54) RF COIL, MAGNETIC RESONANCE SIGNAL MEASURING APPARATUS AND MAGNETIC RESONANCE IMAGING APPARATUS

(75) Inventors: Yukitoshi Shimo; Takayuki Maruyama; Yasushi Kato, all of Tokyo (JP)

(73) Assignee: GE Medical Systems Global Technology Company, LLC, Waikesha, WI (US)

(*) Notice: Subject to any disclaimer, the term of this patent is extended or adjusted under 35 U.S.C. 154(b) by 0 days.

(21) Appl. No.: 09/696,507

(22) Filed: Oct. 24, 2000

(30) Foreign Application Priority Data

Nov. 19, 1999 (JP) .............................. 11-329072

(51) Int. Cl.[7] ................................. G01V 3/00
(52) U.S. Cl. ...................... 324/309; 324/318; 324/307
(58) Field of Search ................ 324/318, 309, 324/307, 322, 300; 128/653.2, 653.5

(56) References Cited

U.S. PATENT DOCUMENTS

| | | | |
|---|---|---|---|
| 5,285,160 A | * | 2/1994 | Loos et al. ............... 324/318 |
| 5,374,890 A | * | 12/1994 | Zou et al. ............... 324/318 |
| 5,664,568 A | * | 9/1997 | Srinivasan et al. ...... 128/653.2 |
| 6,211,677 B1 | * | 4/2001 | Burl et al. ............... 324/322 |

FOREIGN PATENT DOCUMENTS

EP    1 102 075    * 11/2000

* cited by examiner

*Primary Examiner*—Edward Lefkowitz
*Assistant Examiner*—Brij B. Shrivastav
(74) *Attorney, Agent, or Firm*—Moonray Kojima

(57) ABSTRACT

In order to provide an RF coil for effective imaging from a vertex to an upper T spine, a coil surrounding a forehead portion of an imaging object, a coil surrounding a nose portion over the protuberance of the nose, a coil surrounding the neck, and a coil holding the upper T spine, are integrally molded to construct a coil assembly which can be separated into front and rear parts.

17 Claims, 7 Drawing Sheets

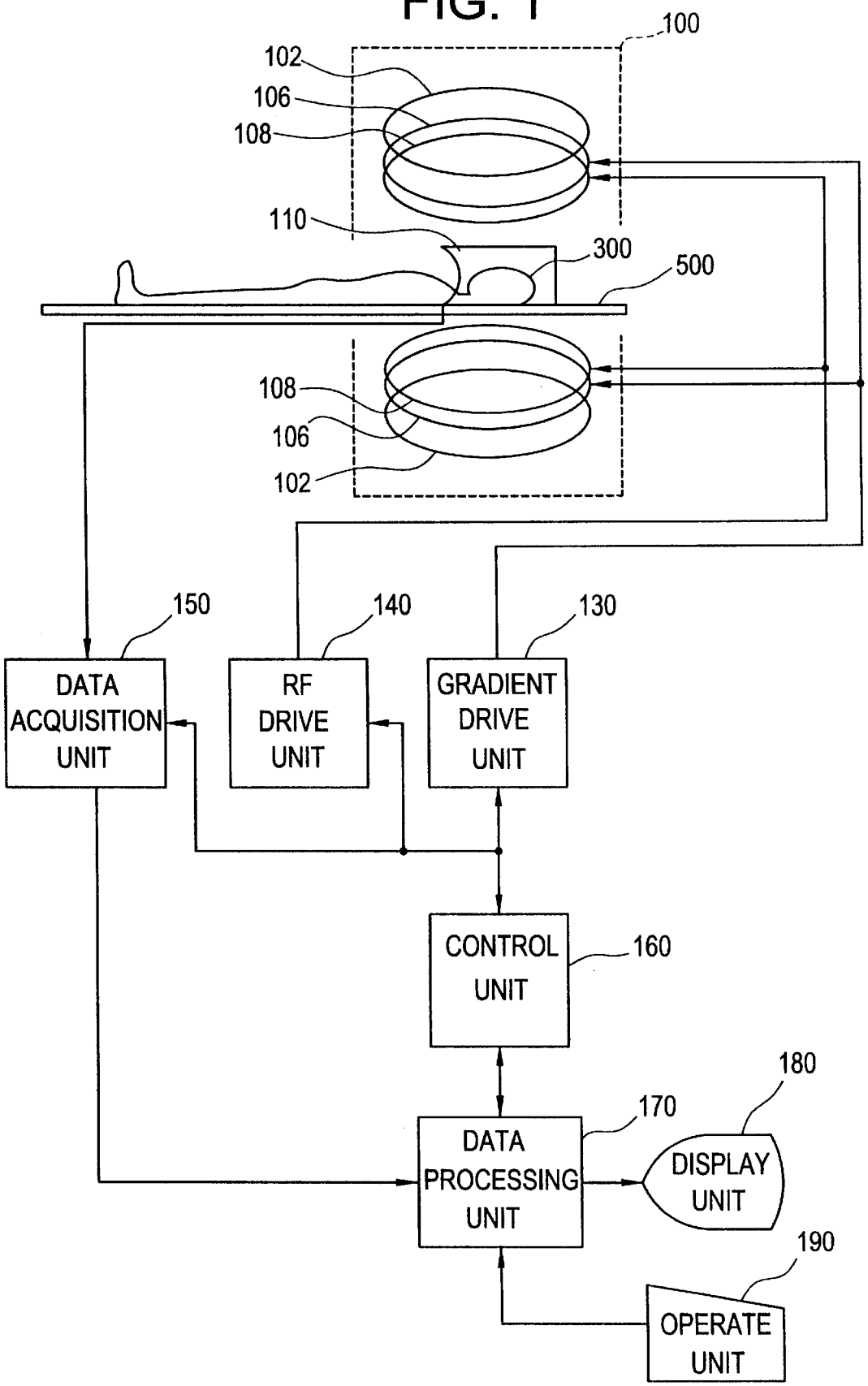

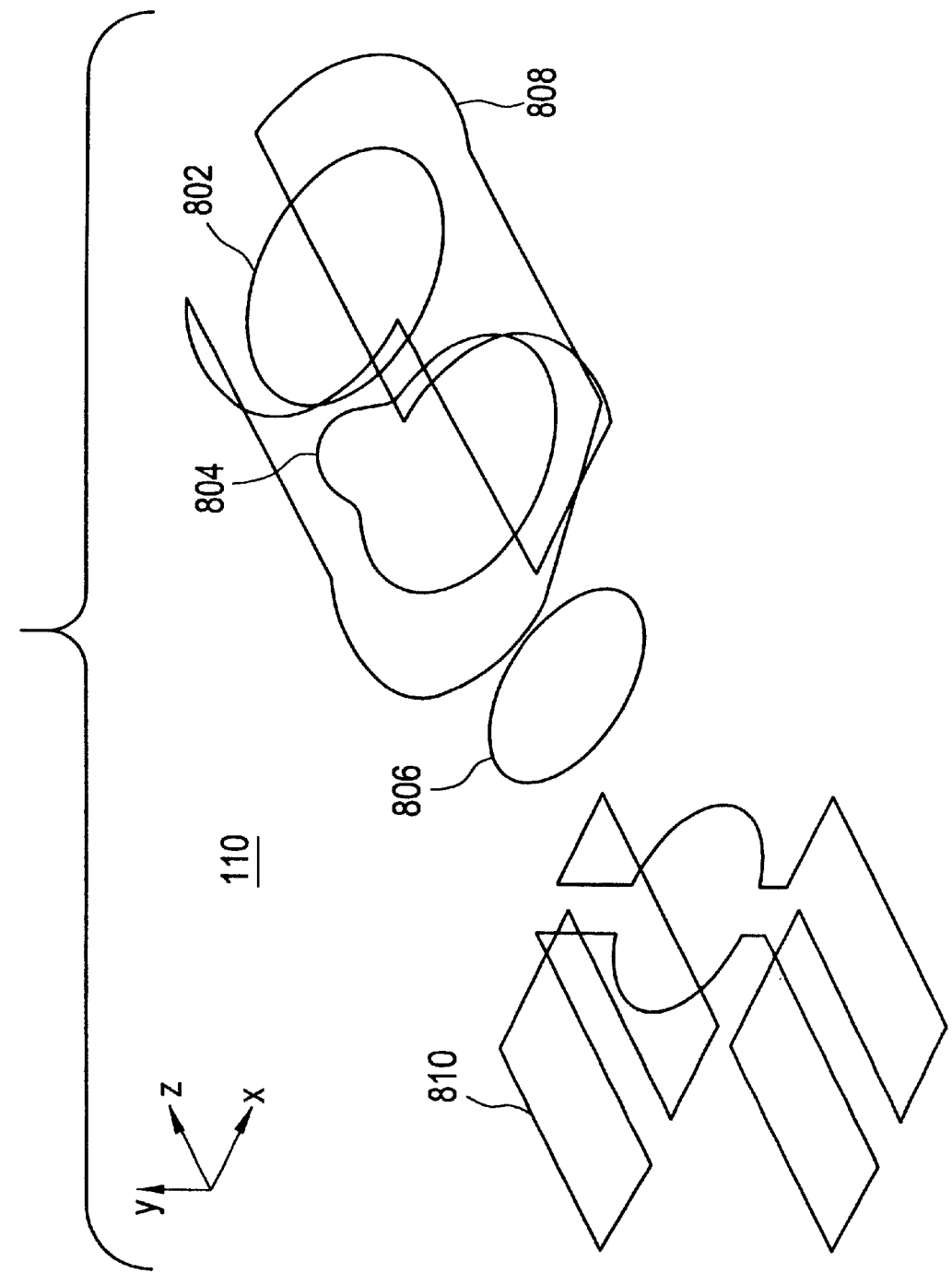

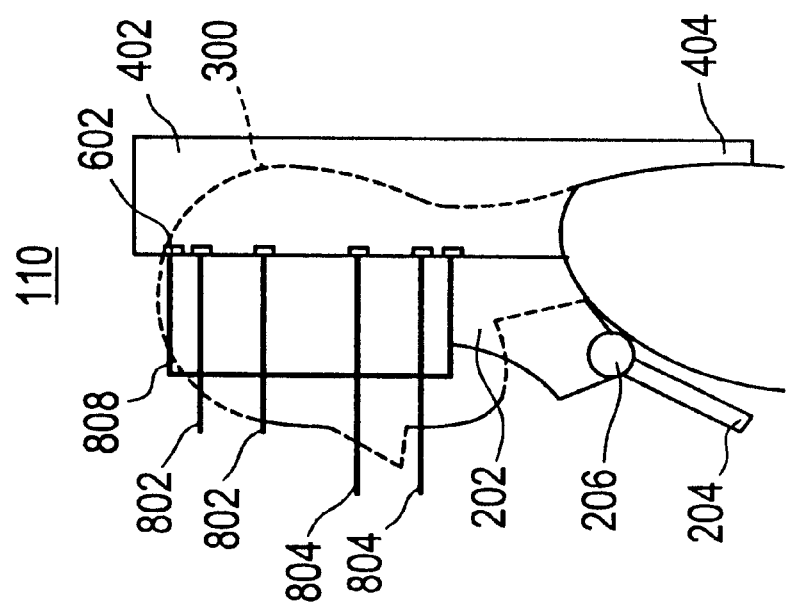
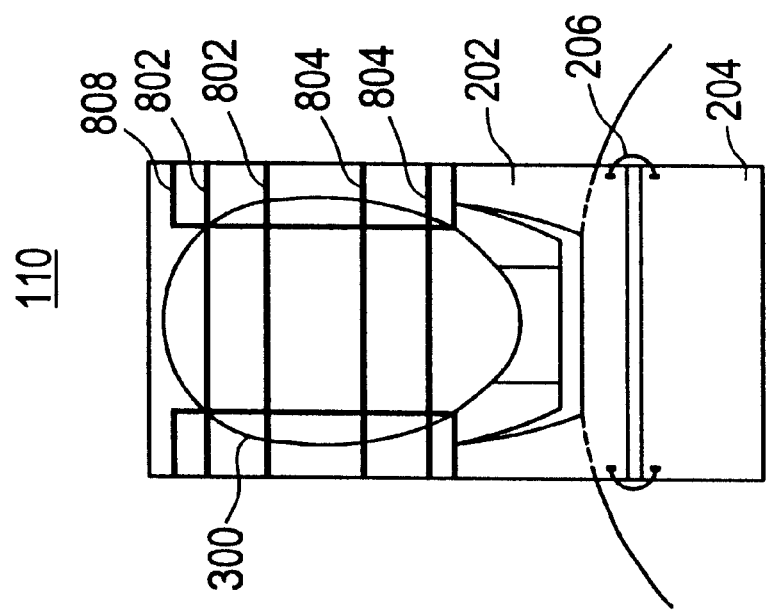

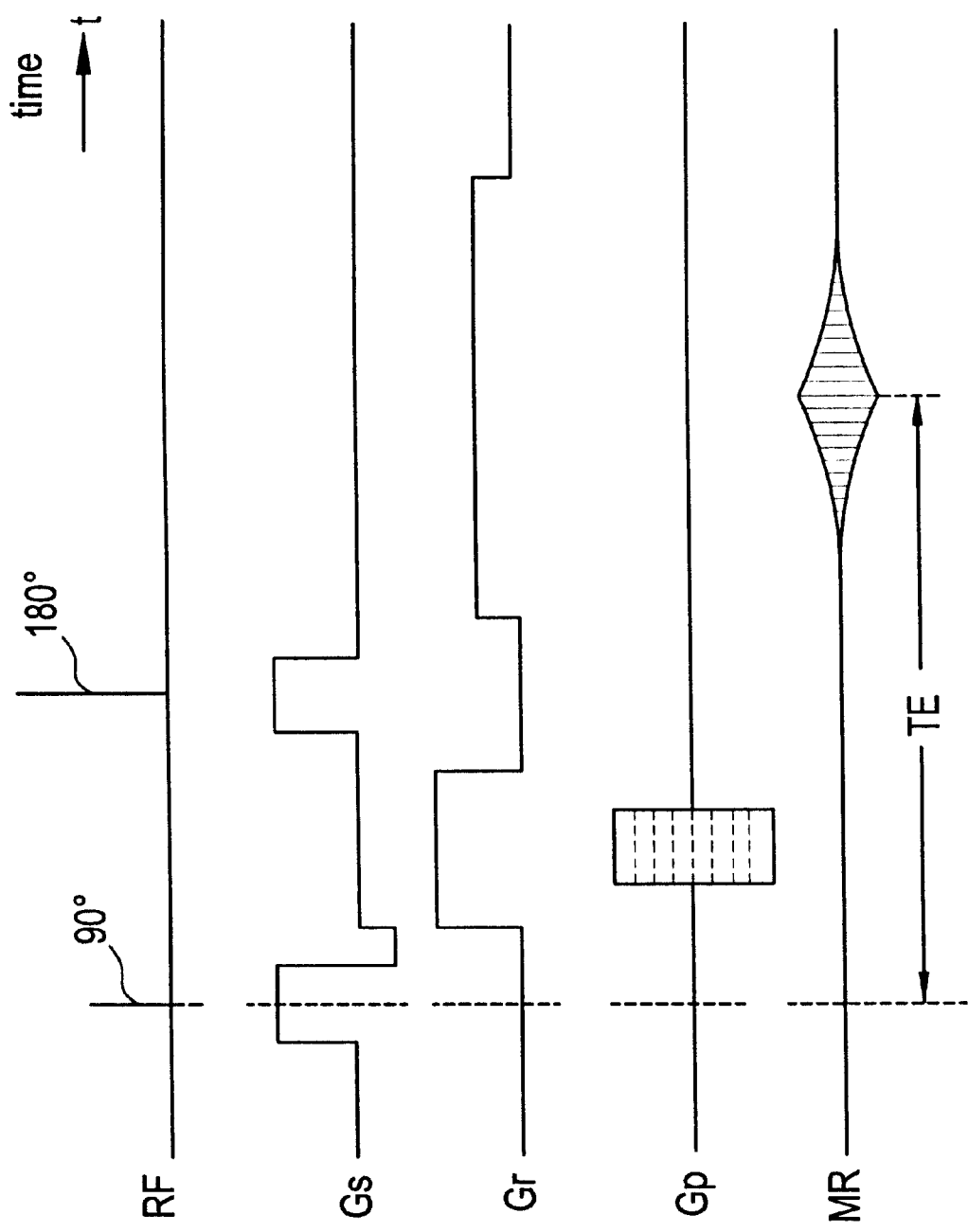

RF COIL, MAGNETIC RESONANCE SIGNAL MEASURING APPARATUS AND MAGNETIC RESONANCE IMAGING APPARATUS

BACKGROUND OF THE INVENTION

The present invention relates to an RF coil (radio frequency coil), a magnetic resonance signal measuring apparatus and a magnetic resonance imaging apparatus, and more particularly, to an RF coil surrounding an imaging object in the proximity of the object, a magnetic resonance signal measuring apparatus using the RF coil and a magnetic resonance imaging apparatus using the magnetic resonance signal measuring apparatus.

In a magnetic resonance imaging (MRI) apparatus, an RF coil is provided in close proximity of imaging object, and a magnetic resonance signal is measured in a position as close as possible to an imaging position so as to improve SNR (signal-to-noise ratio) of the signal.

That is, to perform imaging on a head, a cervical spine (C spine) a thoracic spine (T spine), a lumbar spine (L spine) and the like, RF coils matched to the shapes and sizes of the imaging portions are used.

In head imaging, as a related portions are simultaneously subjected to imaging, it is preferable to use an integrated-type RF coil having an imaging range from a vertex to a neck. As the head and the neck having different diameters are connected in this portion, the diameter of RF coil is adjusted in accordance with the diameter of the head. Accordingly, regarding the neck, signal reception in good SNR cannot be made. Further, in this case, the RF coil must be formed avoiding a nose, the diameter of the coil is too large for the substantial diameter of the head. Accordingly, the SNR is not always high.

Further, in use of integrated type RF coil having an imaging range from the vertex to an upper T spine, if the diameter of the coil is fixed, it is adjusted in accordance with the diameter of the breast. Accordingly, signal reception in good SNR cannot be made regarding the head and neck.

SUMMARY OF THE INVENTION

It is therefore an object of the present invention to provide an RF coil for effective imaging on a head and a neck, a magnetic resonance signal measuring apparatus using the RF coil, and a magnetic resonance imaging apparatus using the magnetic resonance signal measuring apparatus.

Further, it is another object of the present invention to provide an RF coil for effective imaging from a vertex to an upper T spine, a magnetic resonance signal measuring apparatus using the RF coil, and a magnetic resonance imaging apparatus using the magnetic resonance signal measuring apparatus.

(1) In accordance with a first aspect of the invention, there is provided an RF coil comprising: a first coil loop surrounding a head of an imaging object approximately in a forehead and upper portions, divisible along a forward/backward direction of the imaging object; a second coil loop projecting from the imaging object approximately in a nose portion and surrounding the head of the imaging object, divisible along the forward/backward direction of the imaging object; and a third coil loop surrounding a neck of the imaging object, divisible along the forward/backward direction of the imaging object.

In the invention in this aspect, three types of coil loops having diameters respectively corresponding to the forehead portion, the nose portion and the neck are used, and the coils are divisible along the forward/backward direction of the imaging object. By this arrangement, the RF coil is matched to the forehead portion, the nose portion and the neck having different diameters and can accommodate these portions.

(2) In accordance with a second aspect of the invention, there is provided the RF coil according to (1), having a fourth coil loop, substantially orthogonal to respective said first coil loop and said second coil loop on both sides of the head of the imaging object, divisible along the forward/backward direction of the imaging object.

In the invention in this aspect, as coil loops are provided on both sides of the head, the RF coil can perform quadrature signal reception regarding the head.

(3) In accordance with a third aspect of the invention, there is provided the RF coil according (1) or (2), wherein said respective coil loops are respectively integrated by plastic molding on one side and the other side of said division.

In the invention in this aspect, as the respective coil loops are respectively integrated by plastic molding on one side and the other side of division, the imaging object can be easily inserted and removed.

(4) In accordance with a fourth aspect of the invention, there is provided the RF coil according to (3), wherein a front half by said division has openings in portions respectively corresponding to eyes and a jaw of the imaging object.

In the invention in this aspect, the sense of blockage of the imaging object can be mitigated by the openings in the portion corresponding to the eyes. Further, the opening in the portion corresponding to the jaw is formed to avoid hampering the jaw.

(5) In accordance with a fifth aspect of the invention, there is provided the RF coil according to (3) or (4), wherein the front half by said division is molded into a cage with said respective coil loops as its frame.

In the invention in this aspect, as the front half of the RF coil only has a frame, the sense of openness of the RF coil is increased.

(6) In accordance with a sixth aspect of the invention, there is provided The RF coil according to any one of (1) to (5), having a fifth coil loop, passing in front of a breast and in the rear of a back from shoulders of the imaging object, divisible along the forward/backward direction of the imaging object.

In the invention in this aspect, as the fifth coil loop is provided, the image sensing range can be extended to the upper T spine. (7) In accordance with a seventh aspect of the invention, there is provided the RF coil according to (6), wherein in said fifth coil loop, a distance between a part passing in front of said breast and a part passing in the rear of said back is adjustable.

In the invention in this aspect, as the interval between the front and rear parts of the fifth coil loop is adjustable, the coil can be adjusted in accordance with imaging objects having different breast circumferences. (8) In accordance with a eighth aspect of the invention, there is provided the RF coil according to (7), wherein the part passing in front of said breast has a hinge in a portion near the neck of the imaging object.

In the invention in this aspect, the interval can be easily adjusted by the hinge.

(9) In accordance with a ninth aspect of the invention, there is provided a magnetic resonance signal measuring apparatus comprising: a first coil loop surrounding a head of an imaging object approximately in forehead and upper portions, divisible along a forward/backward direction of the imaging object; a second coil loop projecting from the imaging object approximately in a nose portion and surrounding the head of the imaging object, divisible along the forward/backward direction of the imaging object; a third coil loop surrounding a neck of the imaging object, divisible along the forward/backward direction of the imaging object; and magnetic resonance signal measuring means connected to said respective coil loops.

In the invention in this aspect, three types of coil loops having diameters respectively corresponding to the forehead portion, the nose portion and the neck are used, and the coils are divisible along the forward/backward direction of the imaging object. By this arrangement, the RF coil is matched to the forehead portion, the nose portion and the neck having different diameters and can accommodate these parts, and by the RF coil, a magnetic resonance signal can be measured in good SNR.

(10) In accordance with a tenth aspect of the invention, there is provided is a magnetic resonance imaging apparatus comprising: magneto-static field formation means for forming a magneto-static field in space accommodating an imaging object; gradient magnetic field formation means for forming a gradient magnetic field in said space; high-frequency magnetic field formation means for forming a high-frequency magnetic field in said space; a first coil loop surrounding a head of the imaging object approximately in forehead and upper portions, divisible along a forward/backward direction of the imaging object; a second coil loop projecting from the imaging object approximately in a nose portion and surrounding the head of the imaging object, divisible along the forward/backward direction of the imaging object; a third coil loop surrounding a neck of the imaging object, divisible along the forward/backward direction of the imaging object; magnetic resonance signal measuring means connected to said respective coil loops; and image generation means for generating an image based on a magnetic resonance signal measured by said magnetic resonance signal measuring means.

In the invention in this aspect, three types of coil loops having diameters respectively corresponding to the forehead portion, the nose portion and the neck are used, and the coils are divisible along the forward/backward direction of the imaging object. By this arrangement, the RF coil is matched to the forehead portion, the nose portion and the neck having different diameters and can accommodate these parts. By this RF coil, a magnetic resonance signal can be measured in good SNR, and a high-quality image can be generated based on the measured signal.

According to the present invention, it is possible to realize an RF coil for effective imaging on a head and a neck, a magnetic resonance signal measuring apparatus using the RF coil, and a magnetic resonance imaging apparatus using the magnetic resonance signal measuring apparatus.

Further, it is possible to realize an RF coil for effective imaging from a vertex to an upper T spine, a magnetic resonance signal measuring apparatus using the RF coil, and a magnetic resonance imaging apparatus using the magnetic resonance signal measuring apparatus.

Further objects and advantages of the present invention will be apparent from the following description of the preferred embodiments of the invention as illustrated in the accompanying drawings.

BRIEF EXPLANATION OF THE DRAWINGS

FIG. 1 is a block diagram of the apparatus as one example of the working example of the present invention.

FIG. 3 is a schematic diagram showing coil arrangement in the reception coil unit in FIG. 2.

FIGS. 5(A) and 5(B) are diagrams showing the outer appearance of the reception coil unit in the apparatus in FIG. 1.

FIGS. 6(A)–6(E) are diagrams showing the one example of the pulse sequence performed by the apparatus in FIG. 1.

DETAILED DESCRIPTION OF THE INVENTION

Figure 2B:
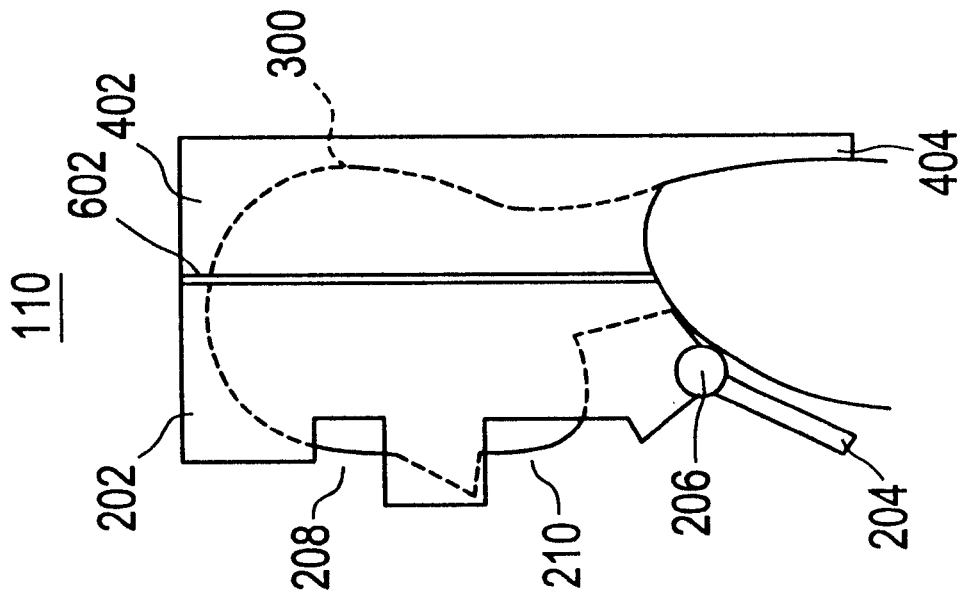
FIGS. 2(A) and 2(B) are diagrams showing the outer appearance of the reception coil unit in the apparatus in FIG. 1.

Hereinbelow, a working example of the present invention will be described in detail with reference to the drawings. FIG. 1 shows a block diagram of a magnetic resonance imaging apparatus. The present apparatus is an example of the working example of the present invention. An example of the working example of the apparatus of the present invention is shown with the construction of the present apparatus.

As shown in FIG. 1, the present apparatus has a magnet system 100. The magnet system 100 has main field magnet units 102, gradient coil units 106 and RF coil units 108. The main field magnet units 102 and the respective coil units are respectively in mutually-opposing pairs with space therebetween. Further, they all have approximately disk shapes and are provided coaxially on the central axis. An imaging object 300, placed on a cradle 500, is inserted and removed into/from inner space of the magnet system 100 by conveyance means (not shown).

The cradle 500 has a reception coil unit 110. The reception coil unit 110 has an approximately cylindrical shape and is provided on an upper surface of the cradle 500. The imaging object 300, with the head inserted in the cylinder of the reception coil unit 110, lies on the back.

The reception coil unit 110 is an example of the working example of the RF coil of the present invention. An example of the working example of the apparatus of the present invention is shown with the construction of the present coil. The reception coil unit 110 will be described later.

The main field magnet units 102 form a magneto-static field in the inner space of the magnet system 100. The main field magnet units 102 are an example of the working example of the magneto-static field formation means of the present invention. The direction of the magneto-static field is orthogonal to anteroposterior axis of the imaging object 300. That is, a so-called vertical magnetic field is formed. The main field magnet units 102 are constructed by using, e.g., permanent magnets. Note that the magnet units 102 may be constructed by using superconducting magnets or non-superconducting magnets as well as the permanent magnets.

The gradient coil units 106 cause gradient magnetic fields to form a gradient in the intensity of the magneto-static field. The generated gradient magnetic fields are three types of fields, a slice gradient magnetic field, a read out gradient magnetic field and a phase encode gradient magnetic field. The gradient coil units 106 include three systems of gradient coils (not shown) in correspondence with the three types of gradient magnetic fields.

The RF coil units 108 transmit an RF excitation signal to the magneto-static field space to excite a spin inside the imaging object. The reception coil unit 110 receives a magnetic resonance signal caused by the excited spin.

The gradient coil units 106 are connected to a gradient drive unit 130. The gradient drive unit 130 supplies a drive signal to the gradient coil units 106 to generate the gradient magnetic fields. A part formed with the gradient coil units 106 and the gradient drive unit 130 is an example of the working example of the gradient magnetic field formation means of the present invention. The gradient drive unit 130 includes three systems of driving circuits (not shown) corresponding to the three systems of gradient coils in the gradient coil units 106.

The RF coil units 108 is connected to an RF drive unit 140. The RF drive unit 140 supplies a drive signal to the RF coil units 108 to transmit the RF excitation signal, to excite the spin inside the imaging object 300. A part constructed with the RF coil units 108 and the RF drive unit 140 is an example of the working example of the high-frequency magnetic field formation means of the present invention.

The reception coil unit 110 is connected to a data acquisition unit 150. The data acquisition unit 150 reads a reception signal received by the reception coil unit 110, and collects it as digital data.

A part constructed with the reception coil unit 110 and the data acquisition unit 150 is an example of the working example of the magnetic resonance signal measuring apparatus of the present invention. An example of the working example of the apparatus of the present invention is shown with the construction of the present measuring apparatus. The data acquisition unit 150 is an example of the magnetic resonance signal measuring means of the present invention.

The gradient drive unit 130, the RF drive unit 140 and the data acquisition unit 150 are connected to a control unit 160. The control unit 160 controls the gradient drive unit 130 to the data acquisition unit 150, respectively.

The output side of the data acquisition unit 150 is connected to a data processing unit 170. The data processing unit 170 stores data read from the data acquisition unit 150 into a memory (not shown). Data space is formed in the memory. The data space constructs two-dimensional Fourier space. The data processing unit 170 converts the data in the two-dimensional fourier space by two-dimensional inverse Fourier conversion, to reconstruct an image of the imaging object 300. The data processing unit 170 is an example of the image generation means of the present invention.

The data processing unit 170 is connected to the control unit 160. The data processing unit 170 is a higher device of the control unit 160 and has control over it. The data processing unit 170 is connected to a display unit 180 and an operation unit 190. The display unit 180 displays the reconstructed image outputted from the data processing unit 170 and various information. The operation unit 190, operated by an operator, is used for inputting various instructions and information into the data processing unit 170.

Figure 2A:
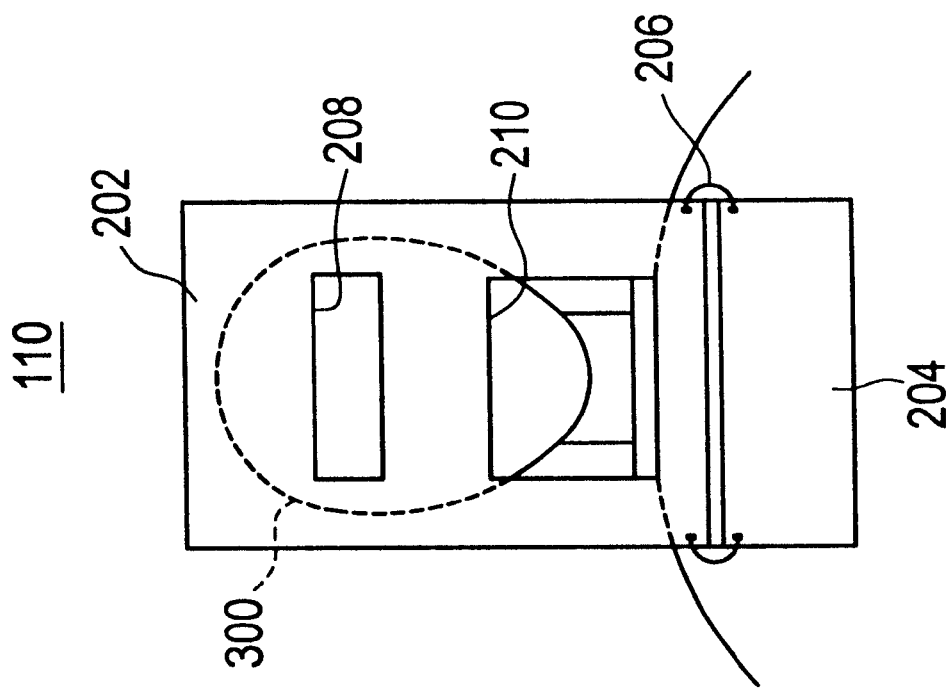

FIGS. 2(A) and 2(B) show the schematic structure of the reception coil unit 110 where the imaging object 300 is accommodated. FIG. 2(*a*) is a front view, and FIG. 2(*b*), a left-side cross-sectional view. As shown in FIGS. 2(A) and 2(B), the reception coil unit 110 has a cylindrical body accommodating the head and the neck of the imaging object 300. The cylindrical body is constructed with nonmagnetic material such as plastics where a coil loop to be described later is molded. In the reception coil unit 110, the vertex side of the imaging object 300 is called an upper side, the neck side, a lower side. Further, the face side of the imaging object 300 is called a front side, the side of the back of the head, a rear side. Further, the left and right sides of the reception coil unit 110 viewed from the imaging object 300 are called the left and right sides of the reception coil unit.

The reception coil unit 110 has a front structure 202 and a rear structure 402. The front structure 202 and the rear structure 402 are mechanically and electrically connected to each other by connectors 602. The connectors 602 are provided on both sides of the cylindrical body. By releasing the connection by the connectors 602, the cylindrical body can be separated into front and rear parts. One of the connectors 602 on both sides may be replaced with a hinge having electrical connection means. In this case, the cylindrical body can be opened/closed sideways like a door with the hinge as the center.

The front structure 202 and the rear structure 402 have a front skirt 204 and a rear skirt 404. The front skirt 204 and the rear skirt 404 hold a portion corresponding to an upper T spine from positions in front of and rear of the imaging object 300. Note that if the imaging range does not include the upper T spine, these skirts are not necessary.

In the front structure 202, the front skirt 204 is attached by a hinge 206 as an attaching member. By this arrangement, the distance between the front skirt 204 and the rear skirt 404 can be adjusted in accordance with the physique of the imaging object 300.

The hinge 206 has electrical connection means for maintaining connection of an 8-shaped coil to be described later. A member used as the hinge 206 of this type is a hinge similar to that used in a note-type personal computer for electrical connection between a display and a main body.

The front structure 202 has an eye opening 208 in a portion corresponding to the eyes of the imaging object 300, and has a jaw opening 210 in a portion corresponding to the mouth to the jaw of the object. The eye opening 208 and the jaw opening 210 are frontward openings. The eye opening 208 opens space in front of the eyes of the imaging object 300. The jaw opening 210 opens space in front of the mouth and the jaw of the imaging object 300.

In the front structure 202, a portion between the eye opening 208 and the jaw opening 210 projects frontward. The inside of this portion has a similar form to the outside. The projection corresponds to the protuberance of the nose of the imaging object 300. An upper portion to the eye opening 208 is formed in an arc approximately along the forehead of the imaging object without projecting forward. The inside of this portion has a similar form to the outside.

Upon accommodation of the imaging object 300 into the reception coil unit 110, first, the front structure 202 is removed, then in this state, the back of the head and the neck of the imaging object 300 are placed in the rear structure 402, and the front structure 202 is attached to the rear structure 402 from the front side. In a case where one side of the coil unit is a hinge, the front structure 202 is opened/closed sideways to insert and remove the imaging object 300.

FIG. 3 shows the schematic structure and arrangement of coil loops of the reception coil unit 110. In FIG. 3, arrows x, y and z represent a leftward/rightward direction, a frontward/backward direction and an upward/downward direction to the imaging object 300.

As shown in FIG. 3, the reception coil unit 110 has a forehead coil 802, a nose coil 804, a neck coil 806, a saddle coil 808 and an 8-shaped coil 810. The forehead coil 802, the nose coil 804, the neck coil 806 and the saddle coil 808 are provided on the main body side of the reception coil unit 110. The 8-shaped coil 810 is provided in the front skirt 204 and the rear skirt 404 in the lower part of the cylindrical body. These coils respectively have a connector (not shown), and are divisible in the frontward/backward direction. Note that the forehead coil 802 and the nose coil 804 are respectively shown as a single loop, however, they may be arbitrary plural loops. Further, if the imaging range does not include the upper T spine, the 8-shaped coils are not necessary.

The forehead coil 802 is an example of the working example of the first coil loop of the present invention. The nose coil 804 is an example of the working example of the second coil loop of the present invention. The neck coil 806 is an example of the working example of the third coil loop of the present invention. The saddle coil 808 is an example of the working example of the fourth coil loop of the present invention. The 8-shaped coil 810 is an example of the working example of the fifth coil loop of the present invention.

All the forehead coil 802, the nose coil 804 and the neck coil 806 are solenoid coils and are provided at predetermined intervals in the z direction. The main direction of sensitivity of these coils is the z direction. These coils having the following circuit construction are so-called phased array coils without substantial electromagnetic coupling.

Figure 4:
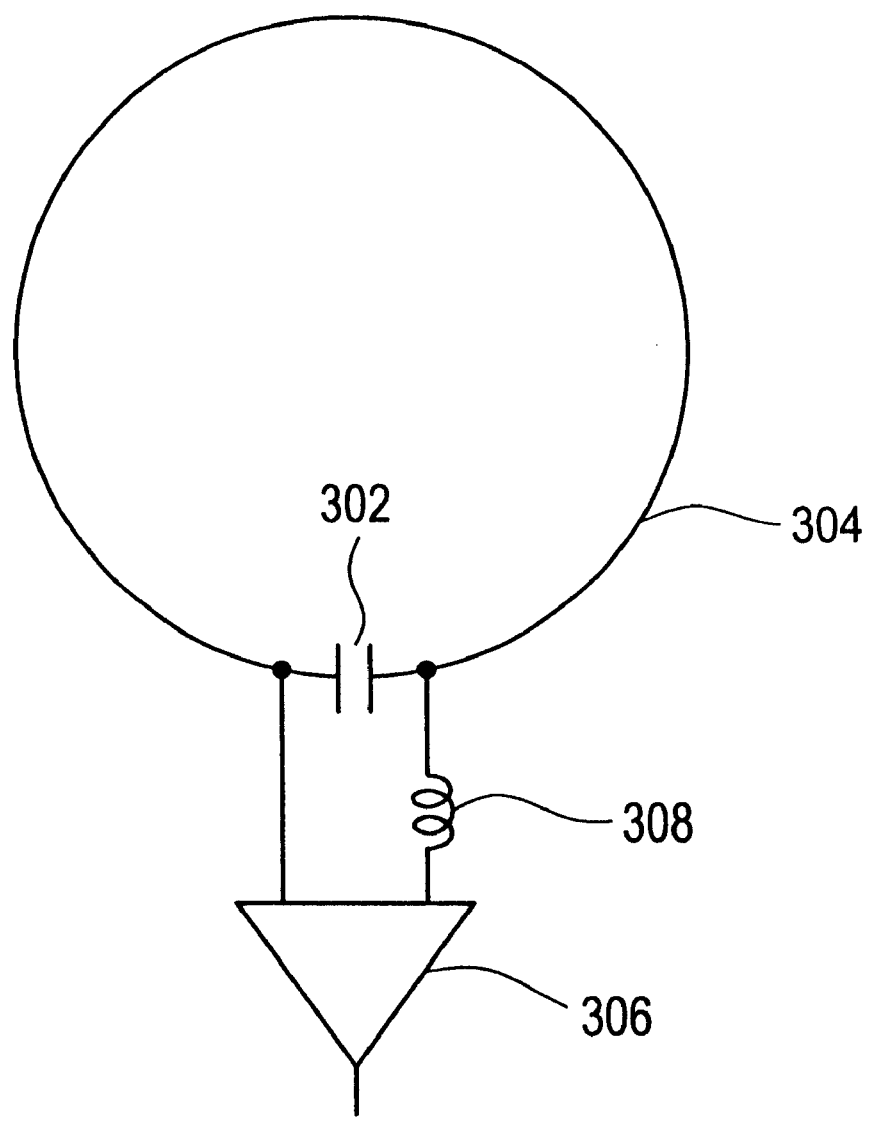
FIG. 4 is a circuit diagram of the coil in FIG. 3.

FIG. 4 shows the electric circuits of unit coil constructing the phased array coil. As shown in FIG. 4, the unit coil is constructed with a serial connection of a capacitor 302 and a conductor 304. The both ends of the capacitor 302 are connected to an input circuit of a preamplifier 306 to amplify a magnetic resonance signal received by the unit coil through an inductor 308. As the preamplifier 306, an amplifier having an input circuit with sufficiently low impedance, i.e., a low-input impedance amplifier is used. The capacitor 302, the preamplifier 306 and the inductor 308 are provided on the rear structure 402 side.

In the unit coil, since the preamplifier 306 is a low-input impedance amplifier, an LC parallel circuit is substantially formed with the capacitor 302 and the inductor 308. The resonance frequency of the LC parallel circuit is selected so as to correspond with that of the magnetic resonance signal. Accordingly, upon reception of the magnetic resonance signal, the LC parallel circuit resonates, and the unit coil substantially enters an open loop state by high impedance by the resonance.

As the forehead coil 802, the nose coil 804 and the neck coil 806 have the above construction, without coupling, they are equivalent to independently existing coils. The saddle coil 808 and the 8-shaped coil 810 also have the same basic circuit construction.

The forehead coil 802 is provided in a position surrounding the head of the imaging object 300 in a forehead portion. The forehead coil 802 is shown as a single coil loop for convenience of illustration, however, it may be plural coil loops.

The loop length of the forehead coil 802 is a little longer than the circumference of the head of the imaging object 300 in the forehead portion. For example, the loop length is appropriate to the great majority of adults who can be the imaging object.

The nose coil 804 is provided in a position surrounding the head of the imaging object 300 in a nose portion. The noise coil 804 is shown as a single coil loop for convenience of illustration, however, it may be plural coil loops. The nose coil 804 forms a loop extending in the y direction in accordance with the protuberance of the nose.

The loop length of the coil is a little longer than the circumference of the head of the imaging object in the nose portion. For example, the loop length is appropriate to the great majority of adults who can be the imaging object.

The neck coil 806 is provided in a position surrounding a neck of the imaging object 300. The neck coil 806 is shown as a single coil loop for convenience of illustration, however, it may be plural coil loops. The loop length of the coil is a little longer than the circumference of the neck of the imaging object. For example, the loop length is appropriate to the great majority of adults who can be the imaging object.

In this manner, in the reception coil unit 110, the forehead coil 802, the nose coil 804 and the neck coil 806 have shapes and lengths corresponding to the respective imaging portions. Especially, the loop length of the forehead coil 802 can be shorter than that of the nose coil 804 since projection to avoid the nose is unnecessary. Accordingly, the distance between the loop and the head surface can be reduced, and signal reception in good SNR can be made. The neck coil 806 has similar advantages.

The saddle coil 808 is provided on the left and right of the forehead coil 802 and the nose coil 804. The direction of main sensitivity of the saddle coil 808 is the x direction orthogonal to that of the forehead coil 802 and the nose coil 804. Accordingly, the saddle coil is not coupled to the forehead coil 802 and the nose coil 804.

So-called quadrature reception is made by vector combination of reception signals from the forehead coil 802, the nose coil 804 and the saddle coil 808. This further improves SNR. Note that the saddle coil 808 can be omitted in some cases.

The 8-shaped coil 810 is provided so as to hold the imaging object 300 from the front and the rear positions in a portion corresponding to the upper T spine. The direction of the main sensitivity of the coil is x direction. Accordingly, the coil is not coupled to the neck coil 806.

A front side part of the 8-shaped coil 810 is provided in the front skirt 204. A rear side part of the 8-shaped coil 810 is provided in the rear skirt 404. The front side part and the rear side part are connected to each other via the electrical connection means of the hinge 206. An electrical path connecting the front side part to the rear side part is provided in the lower part of the cylindrical body.

FIGS. 5(A) and 5(B) show another structure of the reception coil unit 110. The elements similar to those shown in FIGS. 2(A) and 2(B) and 3 have the same reference numerals and explanations of these elements will be omitted. The front structure 202 in FIGS. 5(A) and 5(B) have a part opposite to the face of the imaging object 300, molded so as to form a cage with the forehead coil 802, the nose coil 804 and the saddle coil 808 as a frame. Note that the forehead coil 802 and the nose coil 804 respectively have two coil loops.

By this arrangement, since all the areas are opened except the respective coils, the sense of openness can be greatly improved. Note that in a case where the saddle coil 808 is omitted, another member as a frame in the upward/downward direction is provided and molded.

The operation of the present apparatus will be described. The operation of the present apparatus progresses under the control of the control unit 160. FIGS. 6(A)–6(E) show an example of pulse sequence used in magnetic resonance imaging. The pulse sequence is a spine echo (SE) pulse sequence.

That is, FIG. 6(A) is a sequence of SE 90° pulse and 180° pulse for RF excitation; FIGS. 6(B)–6(E), sequences of slice gradient Gs, read out gradient Gr, phase encode gradient Gp and spin echo MR. Note that the 90° pulse and 180° pulse are represented by respective central signals. The pulse sequence progresses from the left to the right along a time axis t.

As shown in FIGS. 6(A)–6(E), spin 90° excitation is made by the 90° pulse. At this time, the slice gradient Gs is applied and selective excitation is made for a predetermined slice. After a predetermined period from the 90° excitation, 180° excitation by the 180° pulse, i.e., spin inversion is made. At this time, the slice gradient Gs is applied, and selective inversion is made for the same slice.

In a period between the 90° excitation and the spin inversion, the read out gradient Gr and the phase encode gradient Gp are applied. Spin dephase is made by the read out gradient Gr, and spin phase encode is made by the phase encode gradient Gp.

After the spin inversion, the spin is rephased by the read out gradient Gr, to generate the spin echo MR. The spin echo MR becomes an RF signal having a waveform symmetric with respect to the echo center. The central echo occurs after TE (echo time) from the 90° excitation. The spin echo MR is collected as view data by the data acquisition unit 150. Such pulse sequence is repeated 64 to 512 times in a period TR (repetition time) At each repetition, the phase encode gradient Gp is changed, thus phase encoding differs in each repetition. Thus view data of 64 to 512 views can be obtained.

FIGS. 7(A)–7(E) show another example of magnetic resonance imaging pulse sequence. The pulse sequence is gradient echo (GRE) pulse sequence.

Figures 7A, 7B, 7C, 7D, 7E:
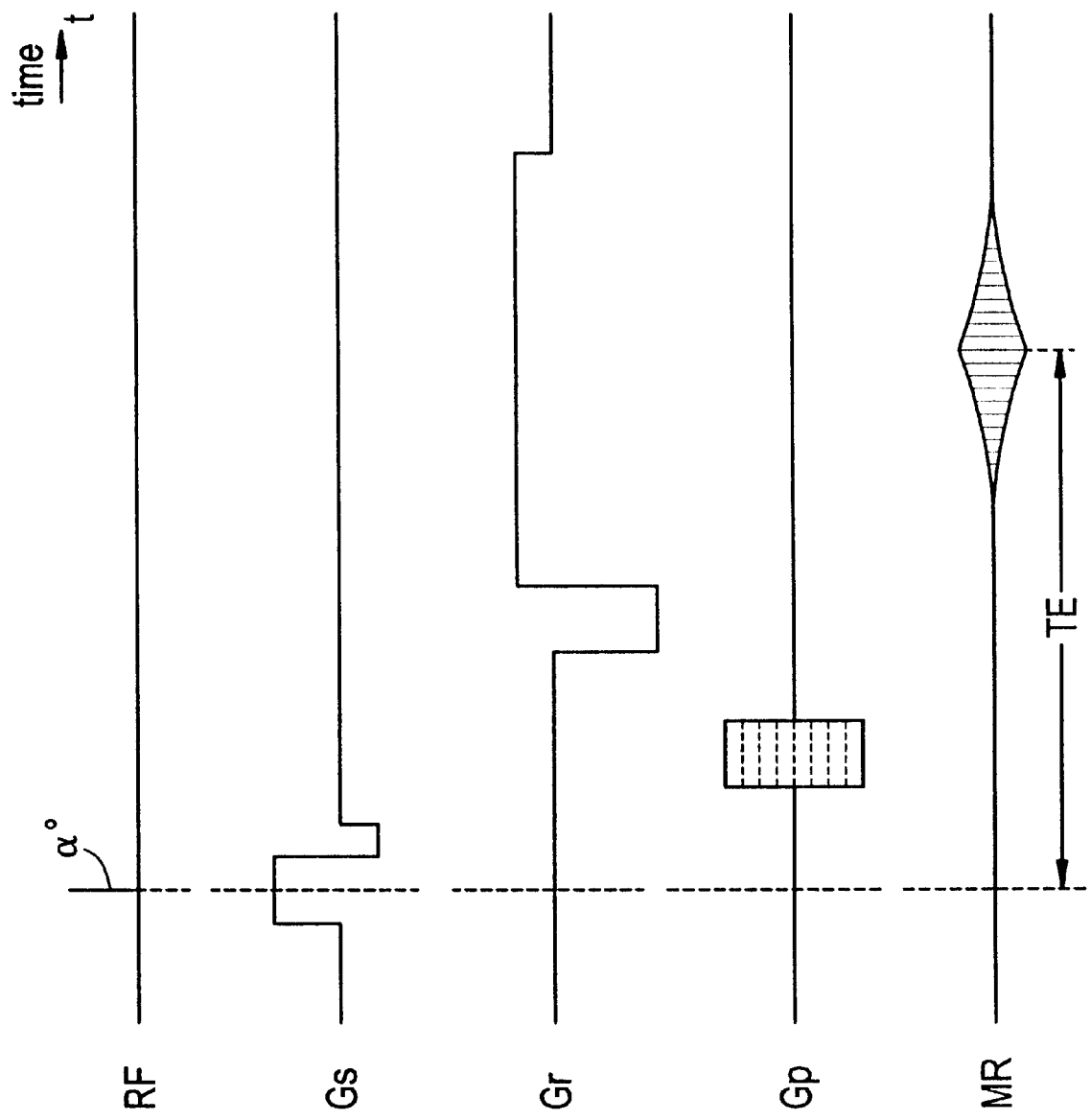
FIGS. 7(A)–7(E) are diagrams showing one example of the pulse sequence performed by the apparatus in FIG. 1.

That is, FIG. 7(A) is a sequence of GRE α° pulse for RF excitation, and FIGS. 7(B)–7(E), sequences of the slice gradient Gs, the read out gradient Gr, the phase encode gradient Gp and the spin echo MR. Note that the α° pulse is represented by its central signal. The pulse sequence progresses from the left to the right along the time axis t.

As shown in FIG. 7(A)–7(E), spin α° excitation is made by the α° pulse, where α is 90 or less. At this time, the slice gradient Gs is applied and selective excitation is made for a predetermined slice.

After the α° excitation, the spin phase encode is made by the phase encode gradient Gp. Next, first, the spin is dephased by the read out gradient Gr, then the spin is rephased, to generate the gradient echo MR. The gradient echo MR becomes an RF signal having a waveform symmetric with respect to the echo center. The central echo occurs after TE from the α° excitation.

The gradient echo MR is collected as the view data by the data acquisition unit 150. The pulse sequence is repeated 64 to 512 times in the period TR. At each repetition, the phase encode gradient Gp is changed, thus phase encoding differs in each repetition. Thus view data of 64 to 514 views can be obtained.

The view data obtained by the pulse sequence in FIGS. 6(A)–6(E) or 7(A)–7(E) is collected in the memory of the data processing unit 170. Note that the pulse sequence is not limited to the SE or GRE method, but it may be based on another arbitrary method such as the fast spin echo (FSE) method.

The data processing unit 170 converts the view data by the two-dimensional inverse Fourier conversion, to reconstruct a tomogram of the imaging object 300. As the effective sensitivity range of the reception coil unit 110 includes the vertex to the upper T spine, a high-quality reconstructed image, where the vertex with related spine is subjected to imaging with excellent sensitivity, can be obtained. The reconstructed image is displayed as a visible image by the display unit 180.

Many widely different embodiments of the invention may be configured without departing from the spirit and the scope of the present invention. It should be understood that the present invention is not limited to the specific embodiments described in the specification, except as defined in the appended claims.

What is claimed is:

1. An RF coil comprising:
   a first coil loop surrounding a head of an imaging object approximately in a forehead and upper portions, said first coil loop being divisible along a forward/backward direction of the imaging object;
   a second coil loop surrounding the head of the imaging object and having a projecting portion which surrounds a nose portion thereof, said second coil loop being divisible along the forward/backward direction of the imaging object; and
   a third coil loop surrounding a neck or the imaging object, said third coil loop being divisible along the forward/backward direction of the imaging object, said first, second and third coil loops being separate from each other.

2. The RF coil of claim 1, having a fourth coil loop, substantially orthogonal to respective said first coil loop and said second coil loop on both sides of the head of the imaging object, divisible along the forward/backward direction of the imaging object.

3. The RF coil of claim 1, wherein said respective coil loops are respectively integrated by plastic molding on one side and the other side of said division.

4. The RF coil of claim 3, wherein a front half by said division has openings in portions respectively corresponding to eyes and a jaw of the imaging object.

5. The RF coil of claim 3, wherein the front half by said division is molded into a cage with said respective coil loops as its frame.

6. The RF coil of claim 1, having a fifth coil loop, passing in front of a breast and in the rear of a back from shoulders of the imaging object, divisible along the forward/backward direction of the imaging object.

7. The RF coil of claim 6, wherein in said fifth coil loop, a distance between a part passing in front of said breast and a part passing in the rear of said back is adjustable.

8. The RF coil of claim 7, wherein the part passing in front of said breast has a hinge in a portion near the neck of the imaging object.

9. A magnetic resonance signal measuring apparatus comprising:
   a first coil loop surrounding a head of an imaging object approximately in forehead and upper portions, said first coil loop being divisible along a forward/backward direction of the imaging object;
   a second coil loop surrounding the head of the imaging object and having a projecting portion which surrounds a nose portion thereof, said second coil loop being divisible along the forward/backward direction of the imaging object;
   a third coil loop surrounding a neck of the imaging object, said third coil loop being divisible along the forward/backward direction of the imaging object, said first, second and third coil loops being separate from each other; and magnetic resonance signal measuring means connected to said respective coil loops.

10. A magnetic resonance imaging apparatus comprising;

magneto-static field formation means for forming a magneto-static field in space accommodating an imaging object;

gradient magnetic field formation means for forming a gradient magnetic field in said space;

high frequency magnetic field formation means for forming a high-frequency magnetic field in said space;

a first coil loop surrounding a head of the imaging object approximately in forehead and upper portions, said first coil loop being divisible along a forward/backward direction of the imaging object;

a second coil loop surrounding the head of the imaging object and having a projecting portion which surround a nose portion thereof, said second coil loop being divisible along the forward/backward direction of the imaging object;

a third coil loop surrounding a neck of the imaging object, said third coil being divisible along the forward/backward direction of the imaging object, said first, second and third coil loops being separate from each other;

magnetic resonance signal measuring means connected to said respective coil loop; and image generation means for generating an image based on a magnetic resonance signal measured by said magnetic resonance signal means.

11. The magnetic resonance imaging apparatus according to claim 10, having a fourth coil loop, substantially orthogonal to respective said first coil loop and said second coil loop on both sides of the head of the imaging object, divisible along the forward/backward direction of the imaging object, wherein said magnetic resonance signal measuring means is also connected to said fourth coil loop.

12. The magnetic resonance imaging apparatus according to claim 10, wherein said respective coil loops are integrated by plastic molding on one side and the other side of said division.

13. The magnetic resonance imaging apparatus according to claim 12, wherein a front half by said division has openings in portions respectively corresponding to eyes and a jaw of the imaging object.

14. The magnetic resonance imaging apparatus according to claim 12, wherein the front half by said division is molded into a cage with said respective coil loops as its frame.

15. The magnetic resonance imaging apparatus according to any one of claims 10, having a fifth coil loop, passing in front of a breast and in the rear of a back from shoulders of the imaging object, divisible along the forward/backward direction of the imaging object, wherein said magnetic resonance signal measuring means is also connected to said fifth coil loop.

16. The magnetic resonance imaging apparatus according to claim 15, wherein in said fifth coil loop, a distance between a part passing in front of said breast and a part passing in the rear of said back is adjustable.

17. The magnetic resonance imaging apparatus according to claim 16, wherein the part passing in front of said breast has a hinge in a portion near the neck of the imaging object.

* * * * *